United States Patent [19]
Thompson

[11] Patent Number: 5,533,586
[45] Date of Patent: Jul. 9, 1996

[54] ADJUSTABLE SUSPENSION SYSTEM

[75] Inventor: Kevin D. Thompson, Thief River Falls, Minn.

[73] Assignee: Arctco, Inc., Thief River Falls, Minn.

[21] Appl. No.: 535,777

[22] Filed: Sep. 28, 1995

Related U.S. Application Data

[63] Continuation of Ser. No. 189,885, Feb. 1, 1994, abandoned.

[51] Int. Cl.$^6$ ............................................... B60G 17/08
[52] U.S. Cl. ........................ 180/193; 188/299; 188/314; 188/317; 280/708; 180/227
[58] Field of Search ................................ 180/193, 190, 180/227; 188/299, 314, 315, 316, 317, 313, 311, 285; 280/708, 698

[56] References Cited

U.S. PATENT DOCUMENTS

| | | | |
|---|---|---|---|
| 1,570,279 | 1/1926 | Pico | 188/299 |
| 1,819,855 | 8/1931 | Wilson | 188/130 |
| 1,921,025 | 8/1933 | Fox | 188/299 |
| 1,929,791 | 10/1933 | Peo | 188/299 |
| 1,950,685 | 3/1934 | McGee | 188/299 |
| 2,070,709 | 2/1937 | Carter | 188/299 |
| 2,752,149 | 6/1956 | Forcellini | 188/314 |
| 2,976,961 | 3/1961 | Mead | 188/314 |
| 3,794,309 | 2/1974 | Chrokey et al. | 267/34 |
| 3,854,710 | 2/1974 | Nicholls | 280/708 |
| 3,974,890 | 8/1976 | Noble | 180/193 |
| 4,159,105 | 6/1979 | Vander Lann et al. | 180/227 |
| 4,491,207 | 1/1985 | Boonchanta et al. | 188/299 |
| 4,546,959 | 10/1985 | Tanno | 188/299 |
| 4,830,395 | 5/1989 | Foley | 280/698 |
| 4,921,080 | 5/1990 | Lin | 188/299 |
| 4,934,491 | 6/1990 | Yamaoka et al. | 188/322 |
| 4,936,424 | 6/1990 | Costa | 188/299 |
| 4,961,481 | 10/1990 | Bartz | 188/130 |
| 5,029,664 | 7/1991 | Zulawski | 180/190 |
| 5,033,572 | 7/1991 | Zulawski | 180/190 |
| 5,042,624 | 8/1991 | Furuya et al. | 188/280 |
| 5,348,112 | 9/1994 | Vaillancourt | 180/227 |

FOREIGN PATENT DOCUMENTS

| 4019212 | 1/1992 | Japan | 188/299 |
|---|---|---|---|

OTHER PUBLICATIONS

"Snow Week" vol. 21 No. 6, Nov. 22, 1993 pp. 2, 12, 13.
"1994 Arctic Cat Snowmobile Service Training" pp. 122, 123.
"1988–1989 Clymer Arctic Cat Snowmobile Shop Manual", pp. 334, 335.
"Snowgoer", Aug., 1993, pp. 4, 5, 94, 95, 96, 97, 98, 99, 100, 101.

*Primary Examiner*—Anne Marie Boehler
*Assistant Examiner*—Peter C. English

[57] ABSTRACT

An adjustable suspension system which has a shock absorber affixed to the suspension system, a movable sealing piston located within a shock absorber for sealing fluid and a suspension adjuster connected to the shock absorber for moving fluid between the adjuster and the shock absorber. A conduit connects the suspension adjuster and the shock absorber. The conduit also includes a hose connecting the suspension adjuster with the shock absorber. A shock housing is adjacent to and outside the shock body. The shock housing surrounds the periphery of the shock body. The shock housing and the shock body define a passageway for fluid. The shock body has a portion that defines at least one port hole between the shock cap and the sealing piston. The shock absorber includes a fluid chamber defined by a shock cap, a shock body, and the sealing piston.

8 Claims, 5 Drawing Sheets

FIG. I (PRIOR ART)

ADJUSTABLE SUSPENSION SYSTEM

CROSS REFERENCE TO RELATED APPLICATION

This is a continuation of copending application Ser. No. 08/189,885 filed on Feb. 1, 1994 now abandoned.

BACKGROUND

The present invention relates to a suspension system which is capable of being adjusted during operation by the operator in response to varying terrains and conditions.

Numerous types of vehicles are used for travel over different surfaces. For example, all-terrain vehicles and snowmobiles may traverse smooth roads, icy paths, deep powder snow, rough terrain then back again to smooth roads, all in a single excursion. The suspension system adjustment for smooth terrain differs from the adjustment for rough terrain. The importance of a properly adjusted suspension system to vehicle performance can be illustrated by snowmobiles.

Quick acceleration and the ability to go through turns with power are some of the most important handling qualities for flat track snowmobile racing. Weight transfer, track tension, spring tension and ski pressure directly affect the handling qualities of the vehicle. Effective weight transfer depends on suspension tension, position of the rider and the position of the front arm 94. Weight transfer in the context of a snowmobile means the shifting of the center of gravity in any direction depending on the force applied. Good weight transfer characteristics are needed for fast acceleration and for cornering. For fast acceleration, it is helpful to shift the weight from the front skis to the snowmobile rear for better traction. For improved cornering, it is helpful to shift the weight forward toward the front skis to hold the snowmobile front end into the turn.

A disadvantage with currently manufactured suspension systems is that a driver is unable to adjust his suspension system while operating the vehicle to match the terrain currently being encountered. For example, in the context of a snowmobile, a driver may move from deep powdered snow onto a long, narrow, icy path up a hill. The driver may need to adjust the snowmobile front or rear suspension systems for proper traction and acceleration up the icy hill and for cornering around the winding path. The driver is not afforded a convenient means for adjusting the snowmobile front or rear suspension systems while driving.

Common methods of adjusting snowmobile suspension require the vehicle to be stopped before any adjustment can begin. Many types of suspension adjustments are inconvenient or impractical when attempted or made in the field.

For example, if trail conditions are ice or hard-packed snow, then a proper suspension adjustment for a snowmobile may be as follows. A rear mounting hole is used to adjust the front arm of the snowmobile rear suspension system. The rear front arm mounting holes are located inside the rear suspension system 70 on the slide rails 98 as shown in FIG. 2. With the front arm mounted in the rear hole, the upper shock absorber eyelet 202 is free-mounted in the lower forward mounting position of the front arm. Then the limiter straps 99 as shown in FIG. 2 are adjusted and secured. Next the front arm eyebolts 92 are adjusted so that there is approximately four inches of clearance between the front arm 94 and the slide rail 98. The suspension system is now set up for riding on hard-packed surfaces or ice.

Later on, if the riding conditions change to loose snow or poor traction conditions which require certain suspension adjustments, the vehicle may have to be stopped again to go through the equally involved procedure for changing the front arm mounting position to the forward hole. Follow the same steps as before in reverse. However, when adjusting the front arm height, adjust the front arm eyebolts 92 to create a standard height gap of 5.5 inches between the front arm 94 and the slide rail 98.

Currently, minor adjustments to the rear suspension system cannot be done on the go and can be slow and inconvenient, especially at night or out in the field.

A further disadvantage to some current suspension systems is with the method for adjusting shock absorber travel. For example, a current method for limiting or enhancing the amount of travel in a shock absorber may involve the use of an eyebolt to adjust the limiter straps. To adjust the front arm eyebolts 92 and limiter straps 99 located in rear suspension system 70, the vehicle must again be stopped. The driver dismounts the snowmobile, the driver lies or kneels down on the ground to reach inside the rear suspension system 70, then turns in the desired direction an eye-bolt locknut with a wrench.

Accordingly, it is the object of the present invention to provide a quick, easy and dynamically adjustable suspension system and method that improves upon or overcomes some of those disadvantages of currently used systems and methods.

SUMMARY

The present invention provides an apparatus and method for adjusting suspension systems which improves upon or overcomes some of the problems and satisfies the needs previously considered. It is an advantage of this invention to provide an apparatus and method for adjusting a suspension system quickly, easily and while on the go.

It is a feature of this invention to have an apparatus for easily adjusting a vehicle suspension system so as to move the center of gravity of the vehicle up or down and forward or backward to improve handling and riding conditions in relation to the terrain. This result is accomplished by having an easily accessible remote control mechanism for altering the stroke of the piston and the overall length of the shock absorber affixed to the suspension system, which mechanism can be adjusted while the operator is seated on the vehicle. The remote control mechanism functions to move the center of gravity of the vehicle by utilizing a movable sealing piston located within a shock absorber so as to seal one portion of the shock absorber from the other and thus alter the stroke of the piston and the overall length of the shock absorber. Lengthening of the shock absorber moves the center of gravity of the vehicle up and rearward if the mechanism is located on a forward-leaning shock absorber, and moves the center of gravity down and forward if the mechanism is located on a rearward-leaning shock absorber when the suspension system and shock absorbers are disposed as shown in FIG. 2. Shortening of the available stroke distance of the shock absorber piston moves the center of gravity of the vehicle down and forward if the mechanism is located on a forward-leaning shock absorber, and moves the center of gravity up and rearward if the mechanism is located on a rearward-leaning shock absorber. Selection of and resultant effort desired in the orientation for the mechanism will depend on the application of the vehicle involved.

The method of adjusting a suspension system includes the steps of: providing a suspension adjuster including an adjuster control; providing a shock absorber; providing a sealing piston inside the shock absorber; applying a force at the suspension adjuster; moving fluid between the suspension adjuster and the shock absorber; moving the sealing piston within the shock absorber; and changing the range of travel for a piston within that shock absorber.

Operation of the adjustable suspension system is as follows. If the driver is leaving rough terrain and then encounters a smooth trail ride, then the driver may wish to reduce the amount of travel in the shock absorber. While simultaneously operating the vehicle, the driver may turn the adjuster control knob 172 clockwise to decrease front arm travel. The suspension adjuster 170 forces liquid through the adjuster hose 174 past the housing coupler 180. Next the fluid flows through a passageway 232 up along the inner shock body 201 towards the shock cap end 206 at the other end of the inner shock body 201. The fluid then exits the passageway 232 by way of a porthole 234 into the fluid chamber 236. As the volume in the fluid chamber 236 increases, the movable sealing piston 230 moves further away from the shock cap end 206 toward the end cap 226. Thus, the range of motion for the piston 222 between the end cap 226 and the movable sealing piston 230 has been reduced, thereby limiting shock absorber travel.

In the event the driver should return to rough terrain, the driver merely needs to turn the adjuster control knob 172 counter-clockwise to increase front arm travel. The fluid flow is the same as before but in reverse. Fluid is withdrawn from the fluid chamber 236 out through the port-hole 234 into the passage way 232. The fluid passes through the adjuster hose 174 to finally the suspension adjuster 170. It is to be understood that within the inventive concept the type of power employed by the suspension adjuster 170 for adjusting suspension is not limited to manual or other types of mechanical power. For one example, the inventor contemplates within the inventive concept of the suspension adjuster 170 an electrically powered push button switch instead of the adjuster control knob 172.

Other objects and advantages of the present invention will be apparent and understood from the following detailed description when taken in conjunction with the accompanying drawings.

BRIEF DESCRIPTION OF THE DRAWINGS

An adjustable suspension system constructed in accordance with this invention is described hereinbelow with reference to the accompanying drawings, wherein;

FIG. 6 is an exploded perspective view of a portion of a snowmobile rear suspension front arm assembly, including a suspension adjuster as disclosed herein;

FIG. 7 is an enlarged detail fragmentary portion perspective of an adjuster control knob of the present invention.

DETAILED DESCRIPTION OF THE INVENTION

Figure 1:
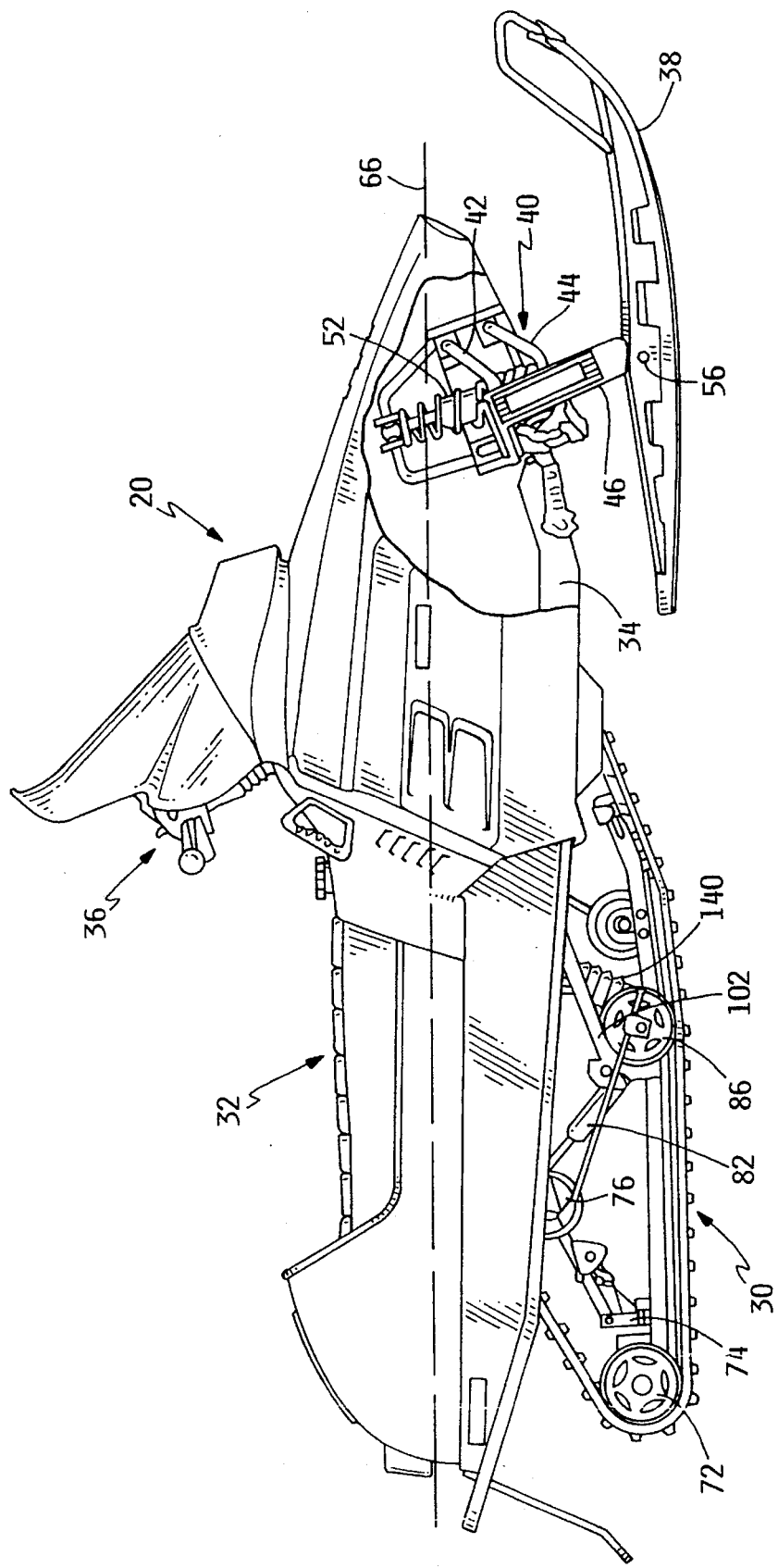
FIG. 1 is a side elevational view of a snowmobile with some parts cut away and other parts removed; it represents the prior art.
Figure 3:
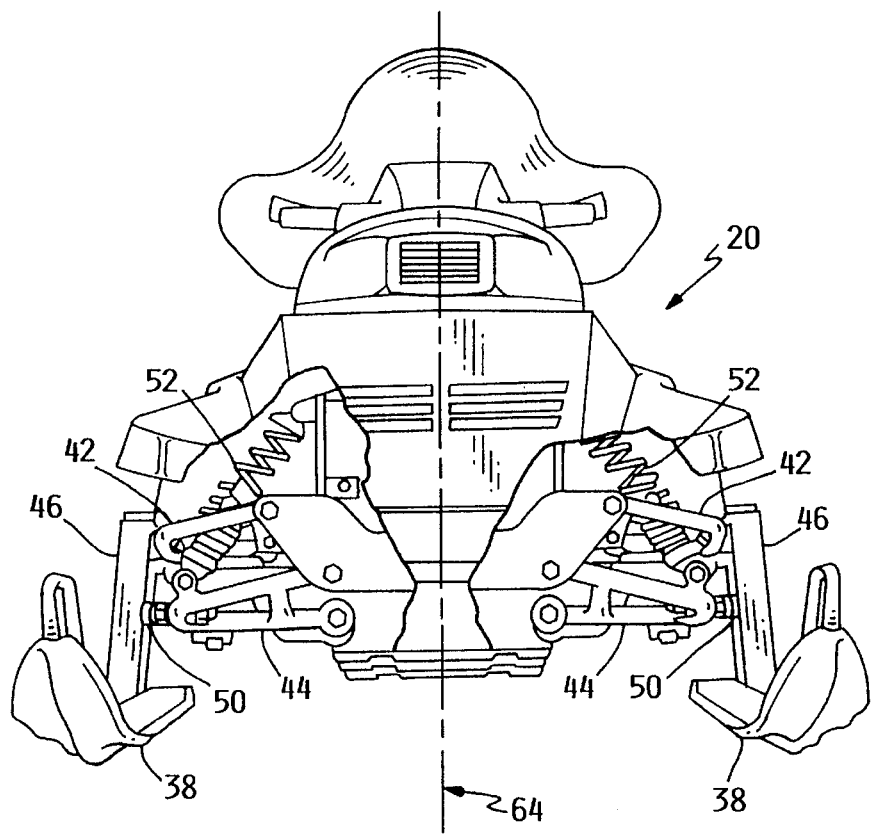
FIG. 3 is a front elevational view of a snowmobile with some parts cut away and other parts being removed; it represents the prior art.

To assist with proper orientation when viewing the drawings, snowmobile 20 has been marked with a longitudinal axis 66 which is shown in FIG. 1 and a vertical plane 64 as shown in FIG. 3. It should be understood that the two sides of the snowmobile front suspension and rear suspension are mirror images of each other across that vertical plane 64. Thus, reference to only one side of the front or rear suspension serves to define the entirety.

Referring now to the drawings, wherein like reference numerals designate like or corresponding parts throughout the several views, FIG. 1 illustrates a snowmobile 20 having a forwardly mounted engine which is not shown. Major snowmobile 20 components include a traction unit 30, a seat area 32, a chassis 34, a steering arrangement 36, a pair of skis 38, a front suspension system 40, and a rear suspension system 70. The snowmobile 20 rear suspension system is located within the traction unit 30.

Three different shock absorbers are depicted in snowmobile 20. A front arm shock absorber 140 and a rear arm shock absorber 82 are both in the rear suspension system 70. Within the front suspension system 40 is a ski shock absorber 52. A separate or combination of adjustable suspension systems are possible wherever a shock absorber is located.

REAR SUSPENSION SYSTEM

Figure 2:
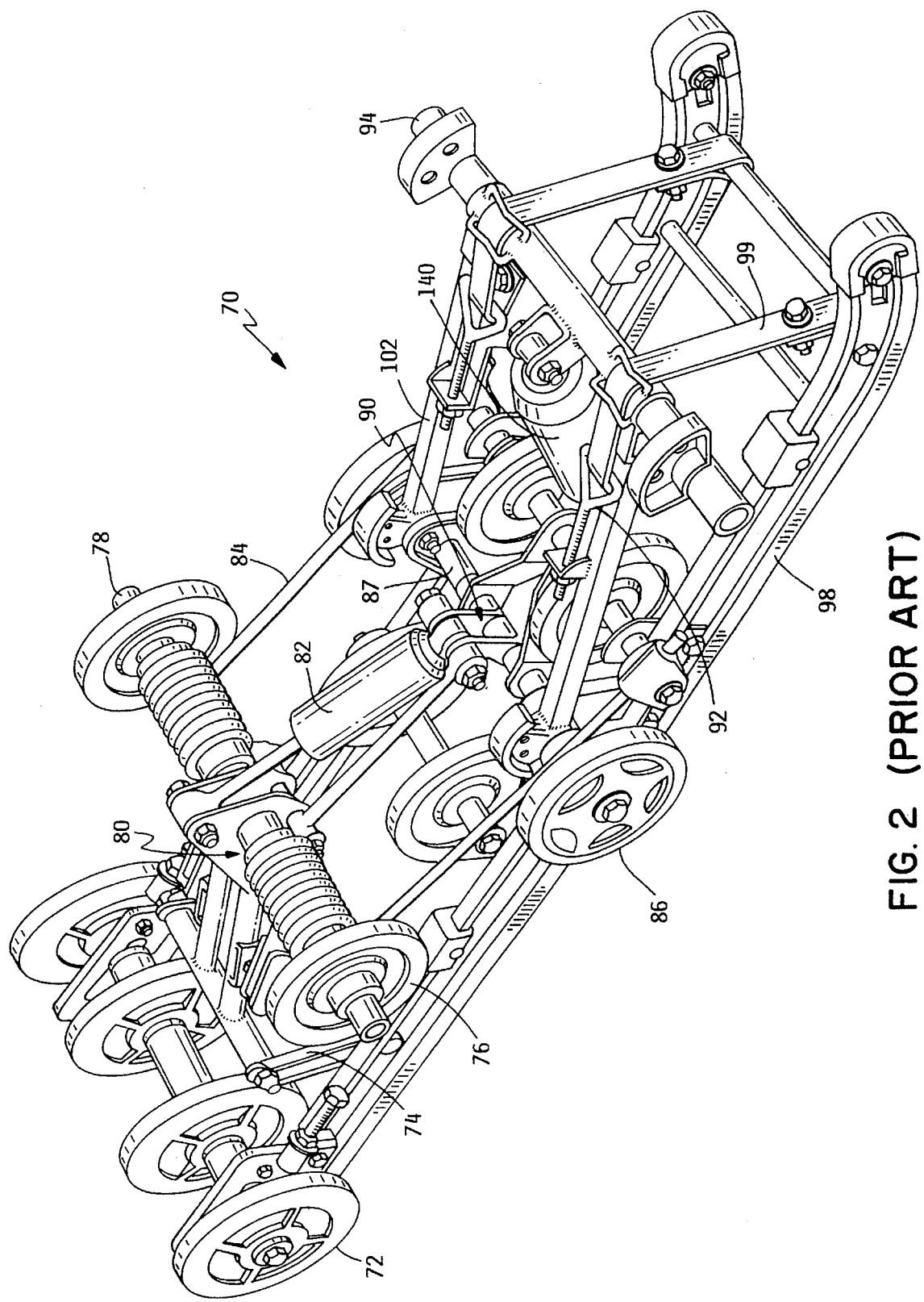
FIG. 2 is a front and side perspective view of a snowmobile prior art rear suspension system.

FIG. 2 illustrates the snowmobile's rear suspension system 70. Both a rear arm 74 and a front arm 94 are located within the rear suspension system 70. A rear arm shock absorber 82 and a front arm shock absorber 140 are also included within the rear suspension system 70. The slide rails 98 which are also known as skid frames serve as a base for a plurality of wheels. The rear suspension system has three sets of idler wheels which extend beyond, outside the slide rails 98. Starting from the snowmobile 20 backend and moving forward, there are rear idler wheels 72, next raised idler wheels 76 and then front idler wheels 86.

The rear arm 74 of the rear suspension system 70 is located between the rear idler wheels 72 and the raised idler wheels 76. Rear arm 74 is welded to the raised idler arm 78. The shock eyelet end of the rear arm shock absorber 82 is bolted to the raised idler bracket 80 located on the raised idler arm 78. A pair of rear suspension springs 84 wrap around the raised idler arm 78. The other end of the rear arm shock absorber 82, the end cap, is bolted to a U bracket 90. The U bracket 90 is welded to the front idler arm 87.

The front arm rail 102 is bolted to the front idler arm 87 and extends forward to its front arm 94. Front arm eyebolts 92 are connected to limiter straps 99 which are used to adjust the relative height of the front arm 94 above the skid frame slide rail 98.

FRONT SUSPENSION SYSTEM

Figure 4:
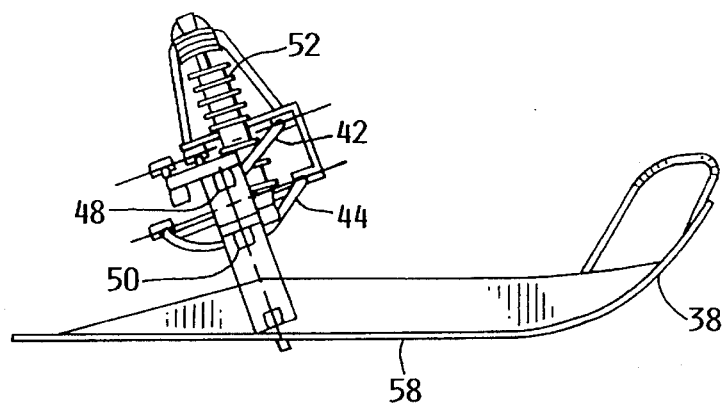
FIG. 4 is a fragmentary side elevational detail of a snowmobile ski suspension system; it represents the prior art.

FIGS. 1, 3, and 4 best illustrate a snowmobile 20 front suspension system 40 in which the invention may be used. The cut-away portion of the snowmobile chassis 34 in FIG.

1 reveals the front suspension system 40. Front suspension system 40 includes a linkage arrangement containing an upper linkage 42 also known as an upper A-frame and a lower linkage 44 generally referred to as a lower A-frame. Upper and lower linkages 42 and 44 interconnect the snowmobile chassis 34 to a spindle 46 which in turn has at its lower end a ski 38 mounted thereto.

Spindle 46 is attached to the upper and lower linkages 42 and 44 by upper and lower ball joints 48 and 50, respectively. Ball joints 48 and 50 are positioned on linkages 42 and 44 such that a shock absorber 52 has clearance in providing an interconnection between lower linkage 44 and chassis 34. Ski 38 is connected at the lower end of spindle 46 by a horizontally disposed hinge pin 56 which is spaced upwardly from the bottom surface 58 of ski 38. Upper and lower linkages 42 and 44 are unitary structures and are generally parallel to one another with upper linkage 42 being shorter than lower linkage 44, when measured along an axis perpendicular to the longitudinal axis 66. Upper linkage 42 is attached by ball joint 48 near the upper end of spindle 46 and lower linkage 44 is attached to spindle 46 between the ends thereof.

REAR SUSPENSION FRONT ARM ASSEMBLY

Figure 5:
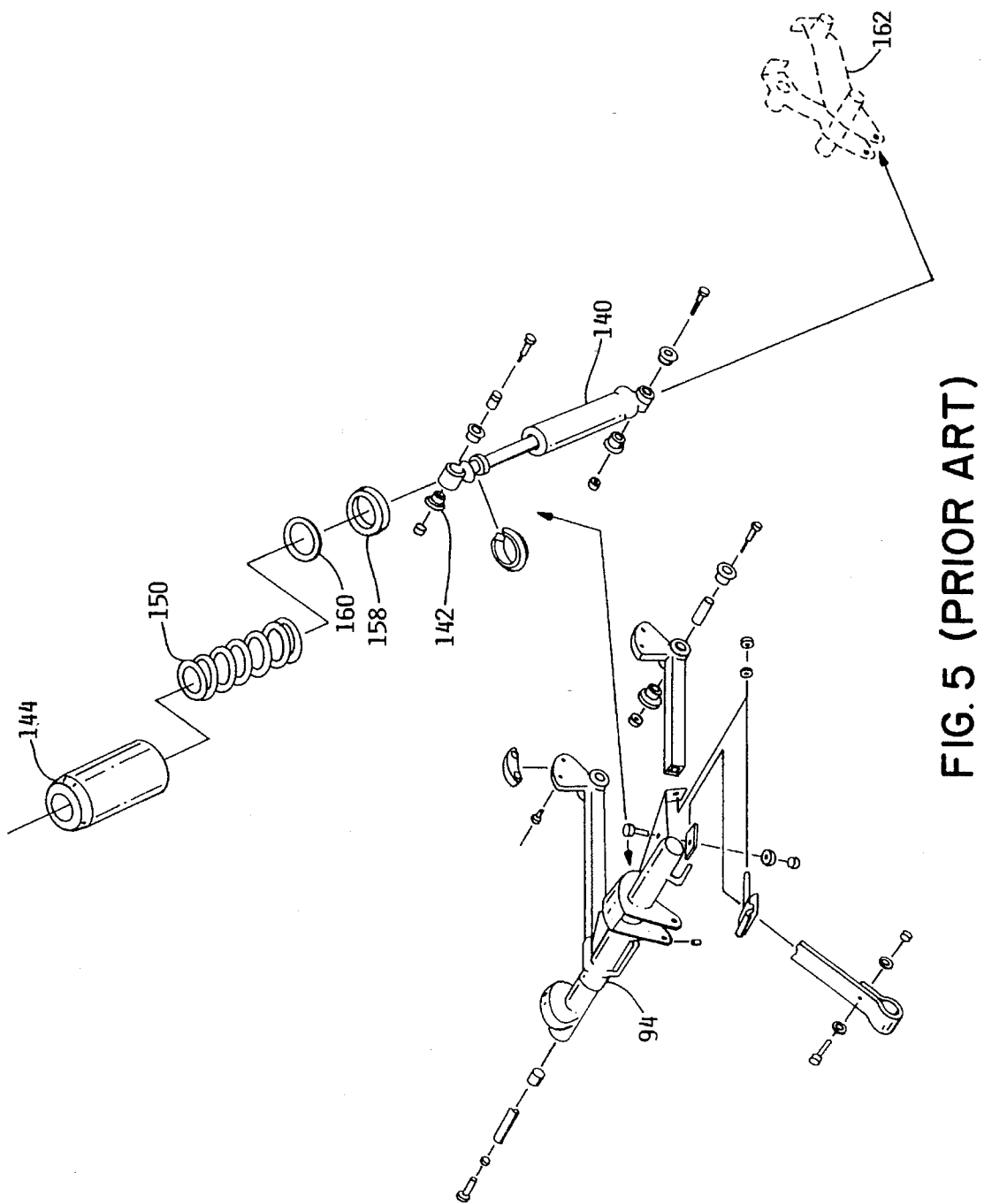
FIG. 5 is an exploded perspective view of a portion of a snowmobile rear suspension front arm assembly depicting the prior art.

FIGS. 5 and 6 display different portions of the rear suspension front arm assembly as found in snowmobile 20. Adjustment of the front arm 94 in the snowmobile rear suspension system 70 is a preferred use for the invention. Placed over the front arm shock absorber 140, is a compression spring cover 144, a compression spring 150, a shock washer 160 and a shock sleeve 158. The end cap 226 of the front arm shock absorber 140 is connected to a front idler wheel Y bracket 162. The upper shock absorber eyelet 202 end of the front arm shock absorber 140 is connected to the front arm 94.

The periphery of the front arm shock absorber 140 is surrounded by a shock housing 178. A preferred embodiment of the shock body is a steel inner shock body 201 surrounded by an aluminum shock housing 178. An adjuster hose 174 is connected to the shock housing 178 by a housing coupler 180 at one end and the other end of the adjuster hose 174 is connected to the suspension adjuster 170 by means of an adjuster coupler 176. An adjuster control knob 172 is screwed into the top of the suspension adjuster 170. The suspension adjuster 170 is fastened to a fastener base 184 in an area easily accessible to the operator.

SHOCK ABSORBER

Figure 8:
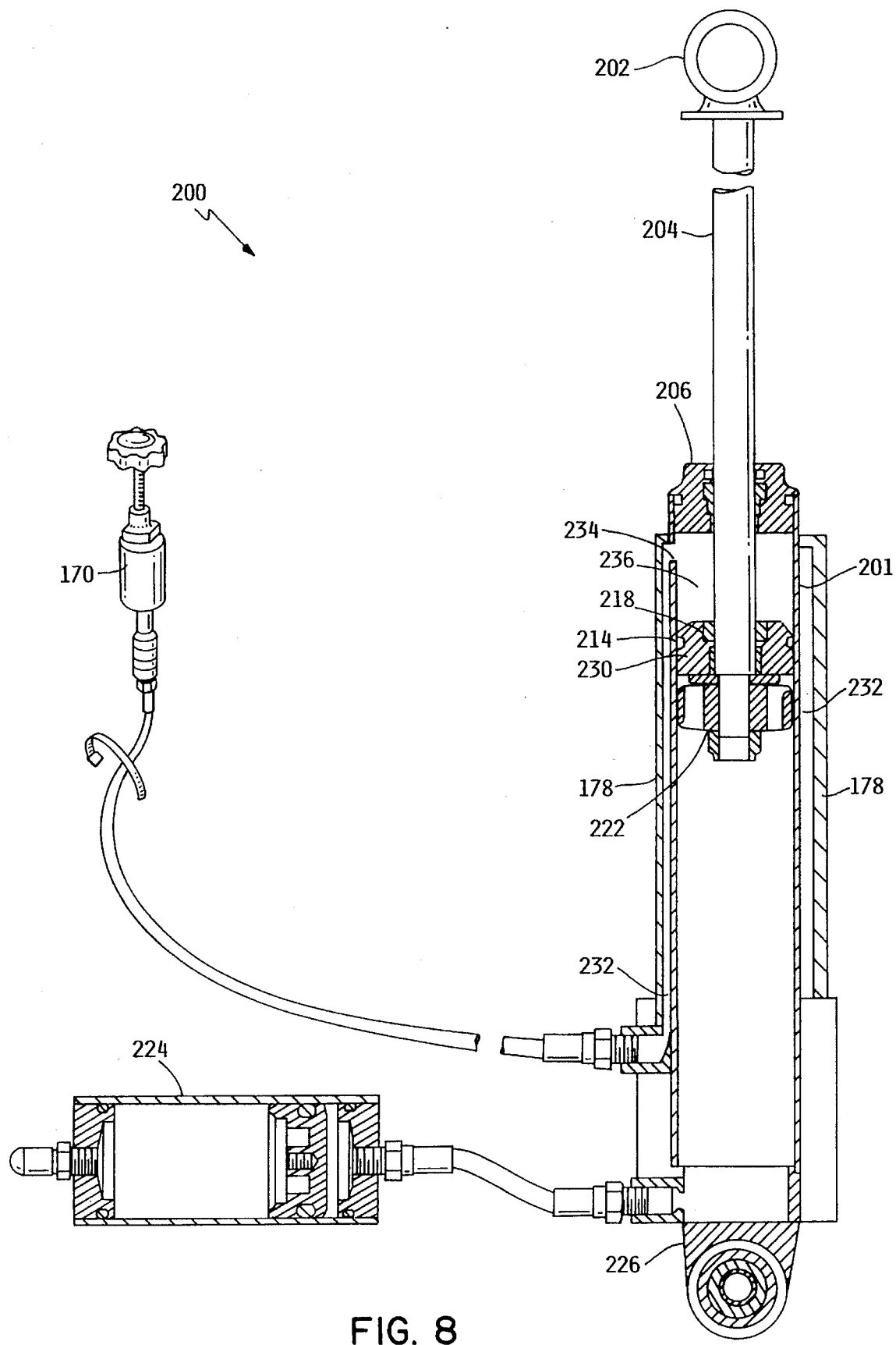
FIG. 8 is a side elevation cross-sectional view of an adjustable shock absorber depicting the structural details of the present invention.

FIGS. 7 and 8 illustrate a preferred embodiment of the invention, which shows an adjustable shock absorber 200 with two hose attachments: an adjuster hose 174 coming from the suspension adjuster 170 and the other hose from the reservoir 224. The adjustable shock absorber 200 has an upper shock absorber eyelet 202 at one end of a shock rod 204. The shock rod 204 extends through a shock cap end 206 and then through a movable sealing piston 230. The shock rod 204 finally terminates with a piston 222. A passage way 232 is formed by the shock housing 178 surrounding the inner shock body 201. A porthole 234 cuts through a portion of the inner shock body 201 near the shock cap end 206. A fluid chamber 236 is created by the inner shock body 201, the shock cap end 206 and the movable sealing piston 230. The movable sealing piston 230 is movable and liquid tight. One embodiment of the movable sealing piston 230 includes seals 214 and bearings. The seals 214 preferably include two quad seals, one on the inner perimeter and one on the outer perimeter of the movable sealing piston 230. A preferred embodiment for the bearings 218 on the movable sealing piston 230 is a wiper and seal shaft.

To visualize how this invention functions within the context of a snowmobile suspension system in operation, it may be helpful from a side view of the snowmobile to focus on three arbitrary, colinear points on the entire snowmobile suspension system: the raised idler arm 78, the front arm 94, both in FIG. 2, and the upper ball joint 48 in FIG. 4. Assume that the front arm 94 functions as a stationary pivot point between the raised idler arm 78 and the upper ball joint 48.

The analogy is that a side view of points on a teeter-totter, at the left seat, middle pivot and right seat corresponds respectively to the points on the snowmobile identified above, the raised idler arm 78, the front arm 94, both in FIG. 2, and the upper ball joint 48 in FIG. 4.

At rest, assume that the teeter-totter is level, parallel to the ground; the left teeter-totter seat, the middle pivot and the right seat are all at the same height off the ground. Assume that at rest on the snowmobile, the upper ball joint 48 is at the same height off the ground as the front arm 94 and the raised idler arm 78.

For traction under acceleration, the relative respective heights off the ground on the teeter-totter are: the left seat descends, the middle pivot is unchanged, and the right seat ascends. Under snowmobile acceleration, the center of gravity is transferred to the rear of the snowmobile 20 with the rear suspension collapsed slightly. Under acceleration, the relative respective heights of the three points off the ground, if viewing from the left, towards the rear of the snowmobile, are: the raised idler arm 78 descends, the front arm rail remains stationary, and the upper ball joint 48 ascends. The teeter-totter effect reduces the pressure on the skis.

For controlled cornering, more pressure is needed on the skis for better turning control. The objective is that when the driver decelerates coming into a corner, the center of gravity is transferred forward, putting the required pressure on the skis and thereby reducing the pressure on the rear suspension. When cornering, the relative respective heights off the ground on the teeter-totter are: the left seat ascends, the middle pivot is unchanged, and the right seat descends. Under snowmobile cornering, the center of gravity is transferred to the front of the snowmobile with the rear suspension rising slightly. When cornering, the relative respective heights of the three points off the ground, still viewing from the left, towards the rear of the snowmobile, are: the raised idler arm 78 ascends, the front arm rail remains stationary, and the upper ball joint 48 descends. The teeter-totter effect increases pressure on the skis.

Thus, how well a vehicle suspension system works depends in part by controlling vehicle weight transfer by adjusting the suspension tension, the position of rider, and the position of the front arm limiter.

Having visualized traction under acceleration and controlled cornering within the context of a snowmobile, operation of the adjustable suspension system can be illustrated as follows. If the driver is leaving rough terrain and then encounters a smooth trail ride, then the driver may wish to reduce the amount of travel in the shock absorber. The driver, while simultaneously operating the vehicle, may turn a front arm adjuster control knob 172 clockwise as desired to decrease front arm travel. The suspension adjuster 170 forces the desired amount of liquid through the adjuster hose 174 past the housing coupler 180. Next the fluid flows through a passageway 232 up along the inner shock body 201 towards the shock cap end 206 at the other end of the inner shock body 201. The fluid then exits the passageway 232 by way of a porthole 234 into the fluid chamber 236. As the volume in the fluid chamber 236 increases as desired, the movable sealing piston 230 moves further away from the shock cap end 206 toward the end cap 226. Thus, the range of motion for the piston 222 between the end cap 226 and the movable sealing piston 230 has been reduced, thereby limiting shock absorber travel.

In event the driver should return to rough terrain and want adjustment, the driver merely needs to turn the front arm adjuster control knob 172 counter-clockwise to increase front arm travel. The fluid flow is the same as before but in reverse. Fluid is withdrawn from the fluid chamber 236 out through the porthole 234 into the passage way 232. The fluid passes through the adjuster hose 174 to finally the suspension adjuster 170.

Thus, one embodiment of a feature of this invention is the apparatus for adjusting a suspension system in motion comprising a shock absorber 200 as shown in FIG. 8 affixed to a suspension system, a movable sealing piston 230 located within a shock absorber 200 for sealing fluid and a suspension adjuster 170 connected to the shock absorber 200 for moving fluid between the suspension adjuster 170 and the shock absorber 200.

More particularly, the apparatus further comprises a conduit connecting the suspension adjuster 170 and the shock absorber 200. Included among the numerous vehicles which may employ the apparatus shock absorber are All-Terrain vehicles, motorcycles and snowmobiles. The apparatus shock absorber 200 includes gas shock absorbers. The conduit further comprises a shock housing 178 adjacent to and outside the inner shock body 201. The shock housing 178 and the inner shock body 201 define a passageway 232 for fluid. The inner shock body 201 has a portion that defines at least one porthole 234 between the shock cap end 206 and the movable sealing piston 230. The shock absorber 200 includes a fluid chamber 236 defined by the shock cap end 206, the inner shock body 201, and the movable sealing piston 230. The shock housing 178 may surround the periphery of the inner shock body 201. The conduit may also include an adjuster hose 174 connecting the suspension adjuster 170 with the shock absorber 200. The apparatus for adjusting a suspension system further comprises an adjuster control knob 172 rotatably connected to the suspension adjuster 170.

The shock absorber 200 in a snowmobile 20 may be connected alone or in combination to a rear suspension system 70 as shown in FIG. 2 having a front arm 94, to a rear suspension system 70 having a rear arm 74 or to a front suspension system 40 as shown in FIG. 1, FIG. 3 and FIG. 4.

A commonly encountered gas shock absorber has a reservoir 224 which contains nitrogen gas. The pressurized gas forces oil into the end cap 226 of the inner shock body 201. Other shock absorbers which lack a reservoir 224 will still work with this invention. For example, shocks with an internal floating piston and no reservoir will still work with this invention.

It is to be understood that alternatives to the displaceable medium which is manipulated by the suspension adjuster 170 could also work, such as other suitable liquids or gases. Moreover, as stated in the Summary, the type of power employed by the suspension adjuster 170 for adjusting suspension is not limited to manual or other types of mechanical power. For one example, the inventor contemplates within the inventive concept of the suspension adjuster 170 an electrically powered push button switch instead of the manually twisted adjuster control knob 172.

Numerous characteristics and advantages of the invention covered by this document have been set forth in the foregoing description. It will be understood that other forms of the Adjustable Suspension System are contemplated by the present invention and that numerous modifications may be made by those with skill in the art without departing from the spirit and scope of the invention defined by the appended claims.

I claim:

1. In a snowmobile having one or more skis, having a chassis, and having one or more slide rails, a fore and aft weight shifting adjusting mechanism interconnected between the chassis and the one or more slide rails including:

a) an adjustable shock absorbing mechanism comprising:
1) a tubular body closed at a base end by a base end cap and closed at a distal end by a rod end cap, including
   aa) said base end cap pivotally connected either to the chassis or to the one or more slide rails;
   bb) a base aperture near the base end of the tubular body for the transfer of hydraulic fluid into and out of the tubular body;
   cc) said rod end cap including an aperture therethrough; and
   dd) a porthole near the rod end of the tubular body for the transfer of hydraulic fluid out of and into the tubular body;
2) a first piston within said tubular body, said first piston defining an aperture for the passage of hydraulic fluid therethrough during shock absorbing movement of said first piston;
3) a first hydraulic fluid chamber defined by said tubular body, a movable sealing piston within the tubular body, and said base end cap;
4) a longitudinal rod passing through the aperture in said rod end cap and connected to said first piston, and a distal end of said longitudinal rod pivotally connected either to the one or more slide rails or to the chassis, wherein if said base end cap of the tubular body is connected to the one or more slide rails then said distal end of said longitudinal rod is connected to the chassis, or vice versa;
5) said movable sealing piston defining an aperture with the longitudinal rod passing therethrough, and said movable sealing piston located between said first piston and said rod end cap; and
6) a second hydraulic fluid chamber defined by said tubular body, said movable sealing piston, and said rod end cap;

b) a suspension adjustor connected to said porthole of the tubular body to allow controlled transfer of hydraulic fluid into and out of said second hydraulic fluid chamber to accomplish longitudinal displacement of the movable sealing piston; and c) a reservoir connected to the base aperture to allow transfer of hydraulic fluid out of and into said first hydraulic fluid chamber;

wherein when hydraulic fluid is transferred from said suspension adjustor through said porthole into said second hydraulic fluid chamber, said movable sealing piston is moved in a direction away from said rod end cap and hydraulic fluid is transferred from said first hydraulic chamber into the reservoir thus moving said movable sealing piston and said first piston toward said base end cap and shortening the length of said adjustable shock absorbing mechanism between said distal end and said base end and shifting the weight of the snowmobile backward away from the one or more skis, and wherein when hydraulic fluid is allowed by said suspension adjustor to be transferred from said second hydraulic fluid chamber through the porthole into the suspension adjustor, said movable sealing piston is moved in a direction toward the rod end cap and hydraulic fluid is transferred from the reservoir thus moving said first piston and said movable sealing piston toward said rod end cap and extending the length of said adjustable shock absorbing mechanism between said distal end and said base end and shifting the weight of the snowmobile forward toward the one or more skis.

2. The mechanism of claim 1 including a spring to bias the rod end away from the base end.

3. In a snowmobile having one or more skis, having a chassis, and having one or more slide rails, a fore and aft weight shifting adjusting mechanism interconnected between the chassis and the one or more slide rails including:

a) an adjustable shock absorbing mechanism comprising:
1) a tubular body having a base end and a distal end, said tubular body closed at said base end by a base end cap and closed at said distal end by a rod end cap, including
aa) said base end cap pivotally connected either to the chassis or to the one or more slide rails;
bb) a base aperture near the base end of the tubular body for the transfer of hydraulic fluid into and out of the tubular body;
cc) said rod end cap including an aperture therethrough; and
dd) a porthole near the distal end of the tubular body for the transfer of hydraulic fluid out of and into the tubular body;
2) a first piston within said tubular body, said first piston defining an aperture for the passage of hydraulic fluid therethrough during shock absorbing movement of said first piston;
3) a first hydraulic fluid chamber defined by said tubular body, a movable sealing piston within the tubular body, and said base end cap;
4) a longitudinal rod passing through the aperture in said rod end cap and connected to said first piston, and a distal end of said longitudinal rod pivotally connected either to the one or more slide rails or to the chassis, wherein if said base end cap of the tubular body is connected to the one or more slide rails then said distal end of said longitudinal rod is connected to the chassis, or vice versa;
5) said movable sealing piston defining an aperture with the longitudinal rod passing therethrough, and said movable sealing piston located between said first piston and said rod end cap; and
6) a second hydraulic fluid chamber defined by said tubular body, said movable sealing piston, and said rod end cap;

b) a suspension adjustor connected to said porthole of the tubular body to allow controlled transfer of hydraulic fluid into and out of said second hydraulic fluid chamber to accomplish longitudinal displacement of the movable sealing piston; and c) a reservoir connected to the base aperture to allow transfer of hydraulic fluid out of and into said first hydraulic fluid chamber;

wherein when hydraulic fluid is transferred from said suspension adjustor through said porthole into said second hydraulic fluid chamber, said movable sealing piston is moved in a direction away from said rod end cap and hydraulic fluid is transferred from said first hydraulic chamber into the reservoir thus moving said movable sealing piston and said first piston toward said base end cap and shortening the length of said adjustable shock absorbing mechanism between said distal end and said base end and shifting the weight of the snowmobile forward toward the one or more skis, and wherein when hydraulic fluid is allowed by said suspension adjustor to be transferred from said second hydraulic fluid chamber through the porthole into the suspension adjustor, said movable sealing piston is moved in a direction toward the rod end cap and hydraulic fluid is transferred from the reservoir thus moving said first piston and said movable sealing piston toward said rod end cap and extending the length of said adjustable shock absorbing mechanism between said distal end and said base end and shifting the weight of the snowmobile backward away from the one or more skis.

4. The mechanism of claim 3 including a spring to bias the rod end away from the base end.

5. In a snowmobile having one or more skis or ski suspension linkages, and having a chassis, a suspension adjusting mechanism interconnected between the chassis and the one or more skis including:

a) an adjustable shock absorbing mechanism comprising:
1) a tubular body having a base end and a distal end, said tubular body closed at said base end by a base end cap and closed at said distal end by a rod end cap, including
aa) said base end cap pivotally connected either to the chassis or to the one or more skis or ski suspension linkages;
bb) a base aperture near the base end of the tubular body for the transfer of hydraulic fluid into and out of the tubular body;
cc) said rod end cap including an aperture therethrough; and
dd) a porthole near the distal end of the tubular body for the transfer of hydraulic fluid out of and into the tubular body;
2) a first piston within said tubular body, said first piston defining an aperture for the passage of hydraulic fluid therethrough during shock absorbing movement of said first piston;
3) a first hydraulic fluid chamber defined by said tubular body, a movable sealing piston within the tubular body, and said base end cap;
4) a longitudinal rod passing through the aperture in said rod end cap and connected to said first piston, and a distal end of said longitudinal rod pivotally connected either to the one or more skis or ski suspension linkages or to the chassis, wherein if said base end cap of the tubular body is connected to the one or more skis or ski suspension linkages then said distal end of said longitudinal rod is connected to the chassis, or vice versa;
5) said movable sealing piston defining an aperture with the longitudinal rod passing therethrough, and said movable sealing piston located between said first piston and said rod end cap; and
6) a second hydraulic fluid chamber defined by said tubular body, said movable sealing piston, and said rod end cap;

b) a suspension adjustor connected to said porthole of the tubular body to allow controlled transfer of hydraulic fluid into and out of said second hydraulic fluid chamber to accomplish longitudinal displacement of the movable sealing piston; and c) a reservoir connected to the base aperture to allow transfer of hydraulic fluid out of and into said first hydraulic fluid chamber;

wherein when hydraulic fluid is transferred from said suspension adjustor through said porthole into said second hydraulic fluid chamber, said movable sealing piston is moved in a direction away from said rod end cap and hydraulic fluid is transferred from said first hydraulic chamber into the reservoir thus moving said movable sealing piston and said first piston toward said base end cap and shortening the length of said adjustable shock absorbing mechanism between said distal end and said base end and thereby altering the suspension to shift the weight of the snowmobile, and wherein when hydraulic fluid is allowed by said suspension adjustor to be transferred from said second hydraulic fluid chamber through the porthole into the suspension adjustor, said movable sealing piston is moved in a direction toward the rod end cap and hydraulic fluid is transferred from the reservoir thus moving said first piston and said movable sealing piston toward said rod end cap and extending the length of said adjustable shock absorbing mechanism between said distal end and said base end and thereby altering the suspension to shift the weight of the snowmobile.

6. The mechanism of claim 5 including a spring to bias the rod end away from the base end.

7. An adjustable shock absorbing mechanism comprising:

1) a tubular body having a base end and a distal end, said tubular body closed at said base end by a base end cap and closed at said distal end by a rod end cap, including aa) a base aperture near the base end of the tubular body for the transfer of hydraulic fluid into and out of the tubular body;

bb) said rod end cap including an aperture therethrough; and cc) a porthole near the distal end of the tubular body for the transfer of hydraulic fluid out of and into the tubular body;

2) a first piston within said tubular body, said first piston defining an aperture for the passage of hydraulic fluid therethrough during shock absorbing movement of said first piston;

3) a first hydraulic fluid chamber defined by said tubular body, a movable sealing piston within the tubular body, and said base end cap;

4) a longitudinal rod passing through the aperture in said rod end cap and connected to said first piston;

5) said movable sealing piston defining an aperture with the longitudinal rod passing therethrough, and said movable sealing piston located between said first piston and said rod end cap; and 6) a second hydraulic fluid chamber defined by said tubular body, said movable sealing piston, and said rod end cap;

7) a suspension adjustor connected to said porthole of the tubular body to allow controlled transfer of hydraulic fluid into and out of said second hydraulic fluid chamber to accomplish longitudinal displacement of the movable sealing piston; and 8) a reservoir connected to the base aperture to allow transfer of hydraulic fluid out of and into said first hydraulic fluid chamber;

wherein when hydraulic fluid is transferred from said suspension adjustor through said porthole into said second hydraulic fluid chamber, said movable sealing piston is moved in a direction away from said rod end cap and hydraulic fluid is transferred from said first hydraulic chamber into the reservoir thus moving said movable sealing piston and said first piston toward said base end cap and shortening the length of said adjustable shock absorbing mechanism between said distal end and said base end; and wherein when hydraulic fluid is allowed by said suspension adjustor to be transferred from said second hydraulic fluid chamber through the porthole into the suspension adjustor, said movable sealing piston is moved in a direction toward the rod end cap and hydraulic fluid is transferred from the reservoir thus moving said first piston and said movable sealing piston toward said rod end cap and extending the length of said adjustable shock absorbing mechanism between said distal end and said base end.

8. The mechanism of claim 7 including a spring to bias a distal end of the rod away from the base end.

* * * * *

UNITED STATES PATENT AND TRADEMARK OFFICE
CERTIFICATE OF CORRECTION

PATENT NO. : 5,533,586
DATED : July 9, 1996
INVENTOR(S) : Kevin D. Thompson

It is certified that error appears in the above-indentified patent and that said Letters Patent is hereby corrected as shown below:

The drawing sheets, consisting of Figs. 6 and 7, should be added as shown on the attached pages.

Signed and Sealed this

Third Day of December, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,533,586
DATED : July 9, 1996
INVENTOR(S) : Kevin D. Thompson

It is certified that error appears in the above-indentified patent and that said Letters Patent is hereby corrected as shown below:

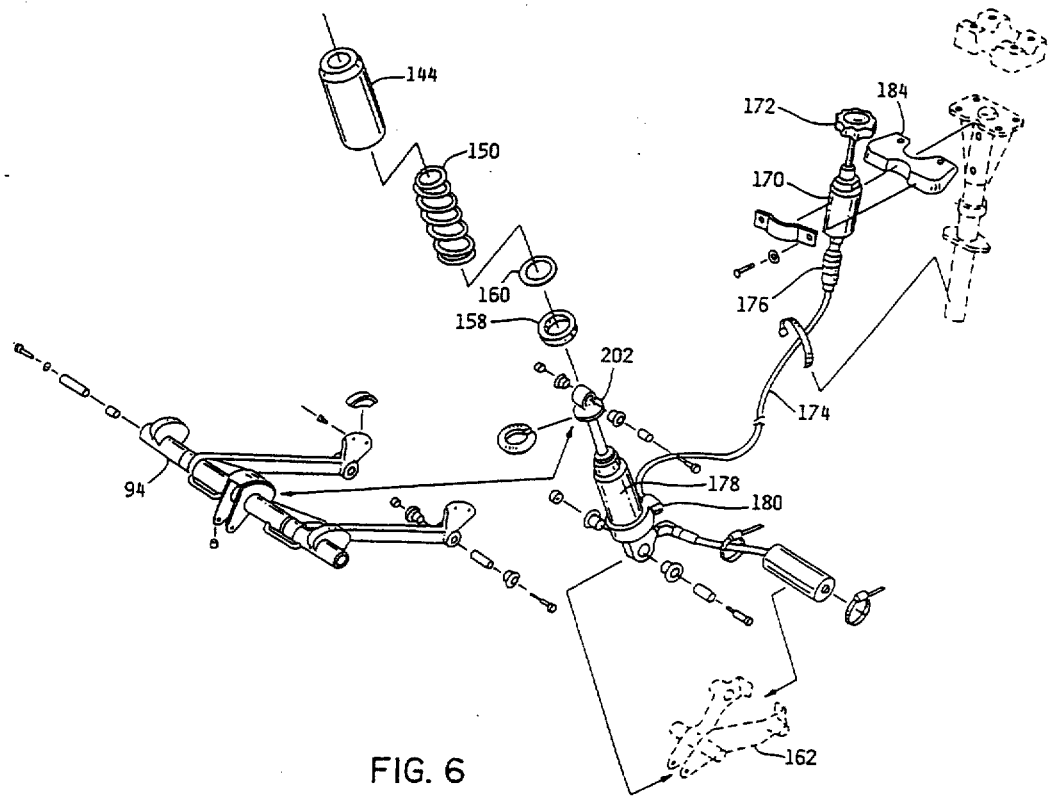

FIG. 6

UNITED STATES PATENT AND TRADEMARK OFFICE
CERTIFICATE OF CORRECTION

PATENT NO. : 5,533,586　　　　　　　　　　　　　Page 3 of 3
DATED　　　 : July 9, 1996
INVENTOR(S) : Kevin D. Thompson It is certified that error appears in the above-indentified patent and that said Letters Patent is hereby corrected as shown below:

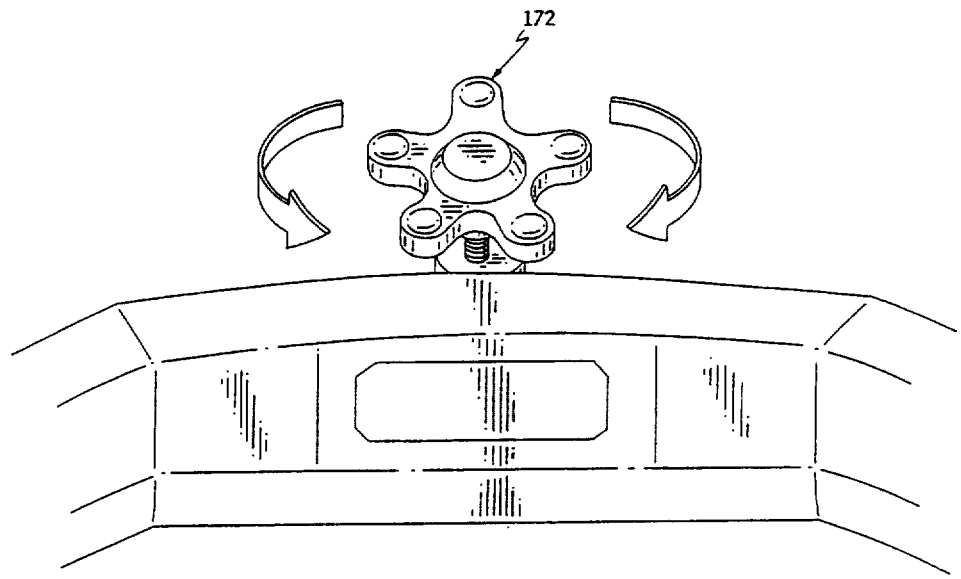

FIG. 7